US012238942B2

(12) United States Patent
Lennon et al.

(10) Patent No.: US 12,238,942 B2
(45) Date of Patent: Feb. 25, 2025

(54) METHOD FOR REDUCING THERMOMECHANICAL STRESS IN SOLAR CELLS

(71) Applicant: LONGi Green Energy Technology Co., Ltd., Xi'An (CN)

(72) Inventors: Alison Joan Lennon, Sydney (AU); Pei-Chieh Hsiao, Sydney (AU)

(73) Assignee: LONGi Green Energy Technology Co., Ltd., Xi'an (CN)

(*) Notice: Subject to any disclaimer, the term of this patent is extended or adjusted under 35 U.S.C. 154(b) by 318 days.

(21) Appl. No.: 17/310,709

(22) PCT Filed: Feb. 18, 2020

(86) PCT No.: PCT/AU2020/050137
§ 371 (c)(1),
(2) Date: Aug. 18, 2021

(87) PCT Pub. No.: WO2020/168380
PCT Pub. Date: Aug. 27, 2020

(65) Prior Publication Data
US 2022/0131023 A1 Apr. 28, 2022

(30) Foreign Application Priority Data
Feb. 18, 2019 (AU) .............................. 2019900521

(51) Int. Cl.
*H10F 19/90* (2025.01)
*H10F 77/20* (2025.01)

(52) U.S. Cl.
CPC ......... *H10F 19/908* (2025.01); *H10F 77/219* (2025.01)

(58) Field of Classification Search
CPC ......... H01L 31/022433; H01L 31/0516; H01L 31/022441; H01L 31/0508; H01L 31/0504;

(Continued)

(56) References Cited

U.S. PATENT DOCUMENTS

2010/0018562 A1 1/2010 Takahisa
2011/0017263 A1* 1/2011 Gibson .................. H01L 31/18
136/246

(Continued)

FOREIGN PATENT DOCUMENTS

CN 103943695 7/2014
FR 2964251 3/2012

(Continued)

OTHER PUBLICATIONS

English machine translation of WO 2017/002287 A1 (Year: 2023).*

(Continued)

*Primary Examiner* — Angelo Trivisonno
(74) *Attorney, Agent, or Firm* — IPro, PLLC

(57) ABSTRACT

The present disclosure provides a method of reducing the thermomechanical stress in the silicon solar cells induced in the interconnection process. The front and rear metal electrodes of the solar cell are provided in such a way that the outermost bonding point between the front metal electrodes and the front interconnects (ribbons or wires) is aligned to the outermost bonding point between the rear metal electrodes and the rear interconnects. The method is applicable to busbar-based interconnection using stringing/tabbing process and wire-based interconnection such as Multi-Busbar and smart wire connection technology. The method can be applied to both mono-facial and bifacial solar cells. The reduced-area busbar end in the busbar-based interconnection increases the tolerance of misalignment of the outermost bonding points introduced by the manufacturing processes.

20 Claims, 10 Drawing Sheets

(58) Field of Classification Search
CPC ........... H01L 31/022425; H01L 31/042; H01L 31/0684; H01L 31/188; Y02E 10/50; H10F 19/908; H10F 77/219
USPC ......................................................... 136/256
See application file for complete search history.

(56) References Cited

U.S. PATENT DOCUMENTS

| | | | |
|---|---|---|---|
| 2011/0155239 A1* | 6/2011 | Biro ................. | H01L 31/02245 257/E31.124 |
| 2012/0138141 A1* | 6/2012 | Kim ................... | H01L 31/1804 136/256 |
| 2016/0322527 A1* | 11/2016 | Hwang ............... | H01L 31/0488 |
| 2017/0373210 A1* | 12/2017 | Sato ................ | H01L 31/022425 |
| 2018/0158970 A1 | 6/2018 | Philwon et al. | |

FOREIGN PATENT DOCUMENTS

| | | | | |
|---|---|---|---|---|
| KR | 2014 0052112 | | 5/2014 | |
| WO | WO-2017002287 A1 | * | 1/2017 | ......... H01L 31/0224 |
| WO | WO 2018/155752 | | 8/2018 | |

OTHER PUBLICATIONS

European Extended Search Report, issued in corresponding application No. PCT/AU2020/050137 on Sep. 29, 2022.
Written Opinion and International Search Report, issued in corresponding application No. PCT/AU2020/050137 on Mar. 31, 2020.

* cited by examiner

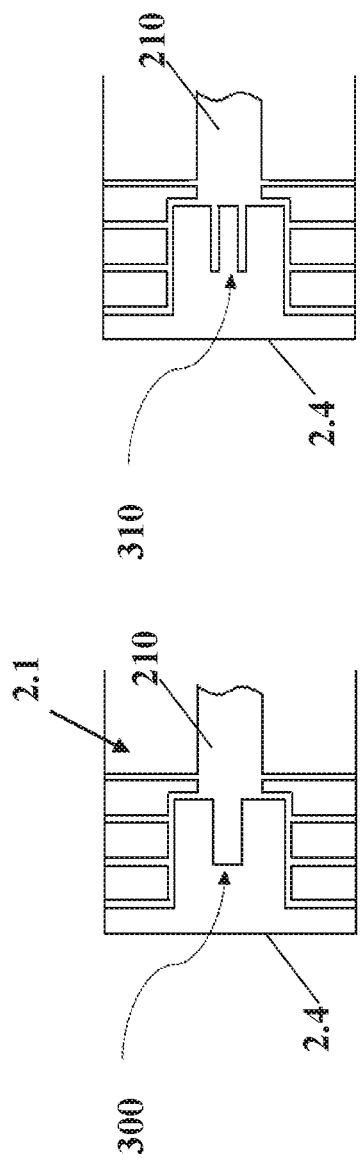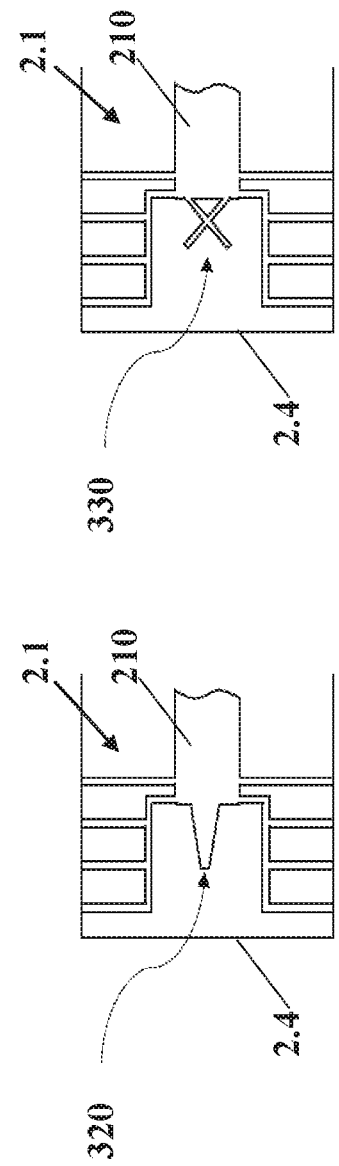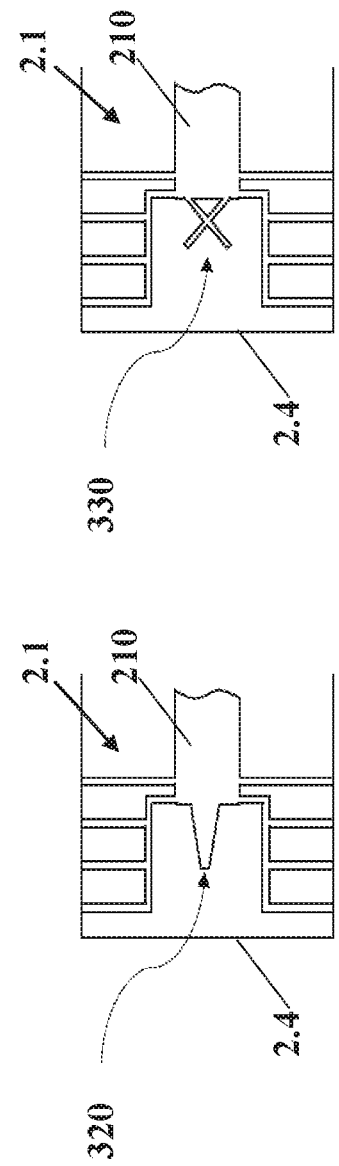

METHOD FOR REDUCING THERMOMECHANICAL STRESS IN SOLAR CELLS

The present application is a U.S. National Phase Application of PCT International Application No. PCT/AU2020/050137 filed on Feb. 18, 2020, and entitled "METHOD FOR REDUCING THERMOMECHANICAL STRESS IN SOLAR CELLS," which claims priority from Australian Patent Application No. 2019900521 filed on Feb. 18, 2019, the contents of each are incorporated herein by reference.

TECHNICAL FIELD OF THE INVENTION

The present invention relates to photovoltaic modules. Particularly but not exclusively, it relates to the pattern and arrangement of the metal electrodes of photovoltaic cells, for the H-pattern interconnection to form a photovoltaic module.

BACKGROUND OF THE INVENTION

Most photovoltaic modules comprise arrays of silicon solar cell devices which are interconnected together. In an "H-pattern" interconnection, the electrodes of one polarity are provided on the front side of the solar cell and the electrodes of the opposite polarity are provided on the rear side. The front metal electrodes of a solar cell are electrically connected to the rear metal electrodes of an adjacent solar cell a conducting interconnection.

The front metal electrodes comprise one or more busbars and a plurality of fingers that are perpendicular to the busbars. The geometry shape of busbars can be full-area or patterned to reduce the amount of material (usually silver) required for the busbar(s).

In mono-facial solar cells, one or more arrays of silver pads are provided on the rear side. The arrays are each in alignment with one busbar provided on the front side. The remaining area on the rear side is formed with a layer of aluminium to provide the lateral conductive path for the current collection on the rear side. In bifacial solar cells, the same number of busbars are provided on the rear side, each being aligned with a corresponding front busbar. However, the rear side can be provided with a different number of fingers than the front side.

In the interconnection process, one or more copper connector pre-coated with solder are aligned to the front busbars of one solar cell and the rear electrodes (silver pads in mono-facial and busbars in bifacial solar cells) of an adjacent solar cell. Localized pressure and heating are applied to the copper connectors, to a temperature above the solder melting point. Electro-mechanical bonding is formed after the solder solidification when the temperature cools down to room temperature. Because of the changes in temperature, and the difference between the coefficients of thermal expansion (CTE) of copper and silicon, thermomechanical stress is induced in the silicon wafer to which the copper connector is bonded. Because copper CTE is larger than silicon, the induced tensile stress in the solar cell is extremely non-uniform and can be over 200 MPa in localized regions, as reported in the literature. This high tensile stress can cause micro-cracks and fractures in the solar cell.

When the solar cells are installed in the field, they are subject to external mechanical load and temperature changes which can enlarge the micro-cracks, degrading the electricity power generation capability of the solar modules.

The solder coated on the copper interconnects is typically made of a lead-based alloy. Alternatively, lead-free solders can be used. The solder temperature needs to be higher than the melting point of the solder material. Soldering at a higher temperature required for lead-free solders further increases the thermomechanical stress in the solar cell.

Busbar-based interconnections (also called stringing/tabbing) have been the industrially-accepted method for many years. A drawback associated with this type of interconnection is the power loss due to series resistance, which poses a challenge to the efficiency of the solar module, particularly as the solar cell efficiency has been increased from the improved carrier collection in the solar cells. Providing an increased number of busbars of reduced widths can reduce the resistive power losses in the fingers and busbars. However, this performance advantage is offset by the increased complexity of aligning narrower busbars required for the automated stringer machine. Furthermore, the flat surface of copper interconnectors, typically called flat ribbons, is the main cause of optical shading loss, as some incident sunlight is reflected by the copper interconnectors and not absorbed by the solar cells.

To address these challenges, wire-based interconnection methods, which do not require busbar contact regions, have been developed. By eliminating the busbar contact regions, the solar cell performance can be improved because the carrier recombination rate at the metal contact regions is much higher than if the silicon is coated with a dielectric layer to passivate the surface defects. Moreover, flat ribbons are replaced with circular copper wires. Since the effective shading width of round wires is only ~70% of the wire diameter, the power losses due to shading are reduced. Another advantage of wire-based interconnection is that more circular wires are typically used than the flat ribbons in the busbar-based interconnection, thus requiring shorter fingers to connect between the wires.

One wire-based interconnection method is Multi-Busbar (MBB) method developed by Schmid Group. Each circular wire requires a number of small discrete contact pads on both sides of the solar cell. Wire alignment to the contact pads can be readily achieved with a pad width of at least 1 mm. Because the MBB method uses the same lead-based solder on the wires as does the flat-ribbon interconnection method, the thermomechanical stress induced in the solar cell is not improved.

Another wire-based interconnection method, smart wire connection technology (SWCT), is commercialized by Meyer Burger. In SWCT, an array of circular wires coated with a low-temperature solder are adhered to and thus embedded in an adhesive polymer. The wire-embedded polymer sheet is placed over the metallized solar cell, which only have fingers. No stringing and alignment is required. The interconnection process is accomplished in the lamination process, where the lamination temperature is higher than the melting point of the low-temperature solder. The lamination process will thereby also form the bond between the wires and the metal electrodes on the solar cells. It has been demonstrated that SWCT can be applied to both mono-facial and bifacial solar cells. Two types of low-temperature solders can be used in SWCT. Eutectic tin-indium alloy was used in the early products. Because of the expensive cost of indium, tin-bismuth-silver alloy is deployed in more recent applications. The use of low-temperature solders can reduce the induced stress in the solar cell.

Regardless of the interconnection method, it is necessary to reduce the thermomechanical stress in the silicon wafer as improved manufacturing technologies have reduced the thickness of solar cells. To resolve the stress issue, several methods have been proposed. One method is to decrease the processing temperature for interconnection by using alternative bonding materials such as electrical conductive adhesives (ECAs) and low-temperature solders. ECAs are more frequently used for the interconnection of solar cells that have both polarities of metal electrodes on the rear side because they result in less wafer bowing. Low-temperature solders have been applied in SWCT. A common drawback of using these alternative bonding materials is the expensive material cost.

Another method is to modify the mechanical properties of the copper interconnectors, which are the main contributor to the thermomechanical stress in the solar cell. Copper interconnectors with a lower CTE can be made, for example, by introducing another element(s) to form a copper alloy. However, a low CTE copper interconnectors has a higher resistivity. To prevent the resistive power loss from increasing, copper interconnects with a larger cross-sectional area is required. Yet, a lager cross-sectional area of the ribbon will adversely increase the shading loss if increasing the interconnect width, offsetting the benefits of stress reduction.

The yield strength of copper interconnectors can be reduced by an annealing process, where the copper grain size is increased. A lower yield strength is achieved according to the Hall-Petch equation. A lower stress in the silicon wafer is induced if the copper interconnectors yield and undergo plastic deformation at a lower stress. However, one concern associated with using low yield copper interconnectors is the increased plastic strain applied to the interconnectors. Sufficient elongation must be achieved to ensure that the copper interconnectors do not fracture in the operating temperature range of the solar cells. Another concern is the increase of yield strength due to the stretching in the interconnection process. The disproportional increment of yield strength requires closely monitoring.

Use of shaped copper interconnects is recently developed by Fraunhofer ISE research institute. The copper wires are wave-shaped with two characteristic parameters: period and amplitude. The amplitude changes in the plane parallel the solar cell surface and perpendicular to the wire direction. Similar to SWCT, no busbars are required on the solar cell and the wave-shaped wires are soldered directly to the fingers. As copper wires can expand and contract in the amplitude direction, thermomechanical stress induced in the solar cells is expected to be reduced. It has been demonstrated that silicon solar cells show no obvious wafer bowing when one side soldered to the wave-shaped wires. This, however, comes at the cost of increased resistive power loss in the wires because the wire length is increased if compared to straight wires. This new method is not comparable to the existing stringer machine and development of new automated equipment is necessary.

It is to be understood that, if any prior art is referred to herein, such reference does not constitute an admission that the prior art forms a part of the common general knowledge in the art, in Australia or any other country.

SUMMARY OF THE INVENTION

Each of the above mentioned prior art techniques for reducing thermos-mechanical stress in the silicon involve disadvantages that hinder a wide adaptation of these techniques by the industrial manufacturers. It is therefore necessary to find an alternative approach to reduce the thermomechanical stress in the solar cell by the interconnection process.

The present invention provides a balanced contact method by the arrangement of metal electrodes and the inclusion of decreased contact area at the end of metal electrodes. The proposed method does not impact the electricity power output of the solar cells and modules. In one aspect, the present invention provides a solar cell having a front surface and a rear surface, each extending between a first edge portion of the solar cell and a second, opposite, edge portion of the solar cell, the first and second longitudinal ends being at either ends of a longitudinal axis of the solar cell;

the front surface including one or more front electrodes or electrode arrays, for forming a front electro-mechanical bond with a front side connector, wherein the front electro-mechanical bond has first and second front bonding end points which are respectively adjacent but spaced from the first and second edge portions of the solar cell;

the rear surface including one or more rear electrodes or electrode arrays, for forming a rear electro-mechanical bond with a rear side connector, between first and second rear bonding end points which are respectively adjacent but spaced from the first and second edge portions of the solar cell;

wherein the front electrodes and the rear electrodes are positioned to define locations of the first front and rear bonding end points which are substantially equally distanced from said first and second edge portions, respectively, and to define locations of the second front and rear bonding end points which are substantially equally distanced from said first and second edge portions, respectively.

One or more front electrodes can each be a front busbar extending in a direction defined by an axis extending between the first and second edge portions, the or each busbar terminating in first and second end sections respectively proximal to the first and second edge portions of the solar cell, wherein a conductive width of the busbar in each end section is smaller than a full width of the busbar, as measured in a direction transverse to the axis extending between. The first and second end sections of the or each front busbar may respectively be spaced from the solar cell's first and second edge portions by about 0.5 mm to 15 mm.

Further, the front surface can include a plurality of finger electrodes which are transverse to the one or more front busbars. The plurality of finger electrodes including a first outermost finger electrode proximal to the solar cell's first edge portion, and a second, opposite, outermost finger electrode proximal to the solar cell's second edge portion. A distance between the solar cell's first edge portion and the first outmost finger electrode is smaller than a distance between the solar cell's first edge portion and a location where the first end section of the or each busbar terminates. Similarly, a distance between the solar cell's second edge portion and the second outmost front finger electrode is smaller than a distance between the solar cell's second edge portion and a location where the second end section of the or each busbar terminates.

Particularly, at each edge portion of the solar cell, for each front busbar, there can be at least one conductive grid line which electrically connects one or more outermost finger electrodes to that front busbar.

The one or more rear electrode or electrode arrays have a first outer edge proximal to the solar cell's first edge portion and a second outer edge proximal to the solar cell's second edge portion. The first outer edge and the location where the first end section of the front busbar terminates are substantially equally distanced from the solar cell's first edge portion. Also, the second outer edge and the location where the second end section of the front busbar terminates are substantially equally distanced from the solar cell's second edge portion. The one or more rear electrode or electrode arrays further can be one or more arrays of electrode pads.

In an alternative embodiment, the one or more rear electrode or electrode arrays are one or more longitudinal rear busbars, each being in correspondence with a respective one of the one or more front busbars, each rear busbar terminating in first and second end sections of reduced conductive width. Further the or each front busbar and the or each rear busbar can be positioned so that they terminate at locations which are substantially equally distanced from the solar cell's first and second edge portions. Still further, the one or more front busbars and the one or more rear busbars may be identical.

In the above embodiments, each front or rear busbar end section can comprise: one or more conductive lines, one or more conductive sections each having a shape which terminates toward the proximal longitudinal end of the solar cell, or, two or more conductive lines which are at an angle.

The above-mentioned embodiments can be mono-facial solar cells.

The above-mentioned embodiments can alternatively be bi-facial solar cells.

In the bi-facial solar cell, the front face and the rear face of the solar cell can be identical.

In an alternative embodiment, the solar cell is adapted for multiple busbar interconnection with a like solar cell. The one or more front electrodes or electrode arrays are each an array of front electrode pads having a first array edge proximate the solar cell's first edge portion, and a second array edge proximate the solar cell's second edge portion. The one or more rear electrodes or electrode arrays are each an array of rear electrode pads, having a first array edge proximate the solar cell's first edge portion, and a second array edge proximate the solar cell's second edge portion. The first array edges of each array of front electrode pads and the or each array of rear electrode pads are substantially equally distanced from the solar cell's first edge portion. Also, the second array edges of each array of front electrode pads and each array of rear electrode pads are substantially equally distanced from the solar cell's second edge portion.

In a further alternative embodiment, one or more front electrodes or electrode arrays are front finger electrodes arranged between the first and second edge portions of the solar cell, extending in a direction which is transverse to an axis extending between the first and second edge portions. The front finger electrodes include a first outermost front finger electrode which is closest to the solar cell's first edge portion, and a second outermost front finger electrode which is closest to the solar cell's second edge portion. The one or more rear electrodes or electrodes arrays comprise a first rear finger electrode which is substantially equally distanced from the solar cell's first edge portion as the first outermost front finger electrode, and a second rear finger electrode which is substantially equally distanced from the solar cell's first edge portion as the second outermost front finger electrode.

In the above-mentioned embodiment, the one or more rear electrodes or electrode arrays comprise one or more further rear finger electrode located between the first and second rear finger electrodes. Further, the spacing between adjacent ones of the rear finger electrodes and the spacing between adjacent ones of the front finger electrodes can be different.

In a different aspect, the invention provides a solar module comprising two or more solar cells as mentioned in one or more of the preceding paragraphs, interconnected together via tabbing or ribbon interconnection.

In a different aspect, the invention provides a solar module comprising two or more solar cells as mentioned in one or more of the preceding paragraphs, interconnected together using the multiple busbar interconnection method.

In a different aspect, the invention provides a solar module comprising two or more solar cells as mentioned in one or more of the preceding paragraphs, interconnected together via the smart wire connection technology.

BRIEF DESCRIPTION OF THE DRAWINGS

The embodiments of the invention will now be described, by way of example, with reference to the accompanying drawings in which:

FIGS. 3-1 to 3-4 schematically depict busbars of various patterns, on the front side of a mono-facial silicon solar cells, in accordance with embodiments of the present invention;

FIG. 4 is a schematic diagram that depicts a typical layout of metal electrodes (only one busbar is shown) of a bifacial solar cell for busbar-based interconnection;

DETAILED DESCRIPTION OF EMBODIMENTS

Figure 1:
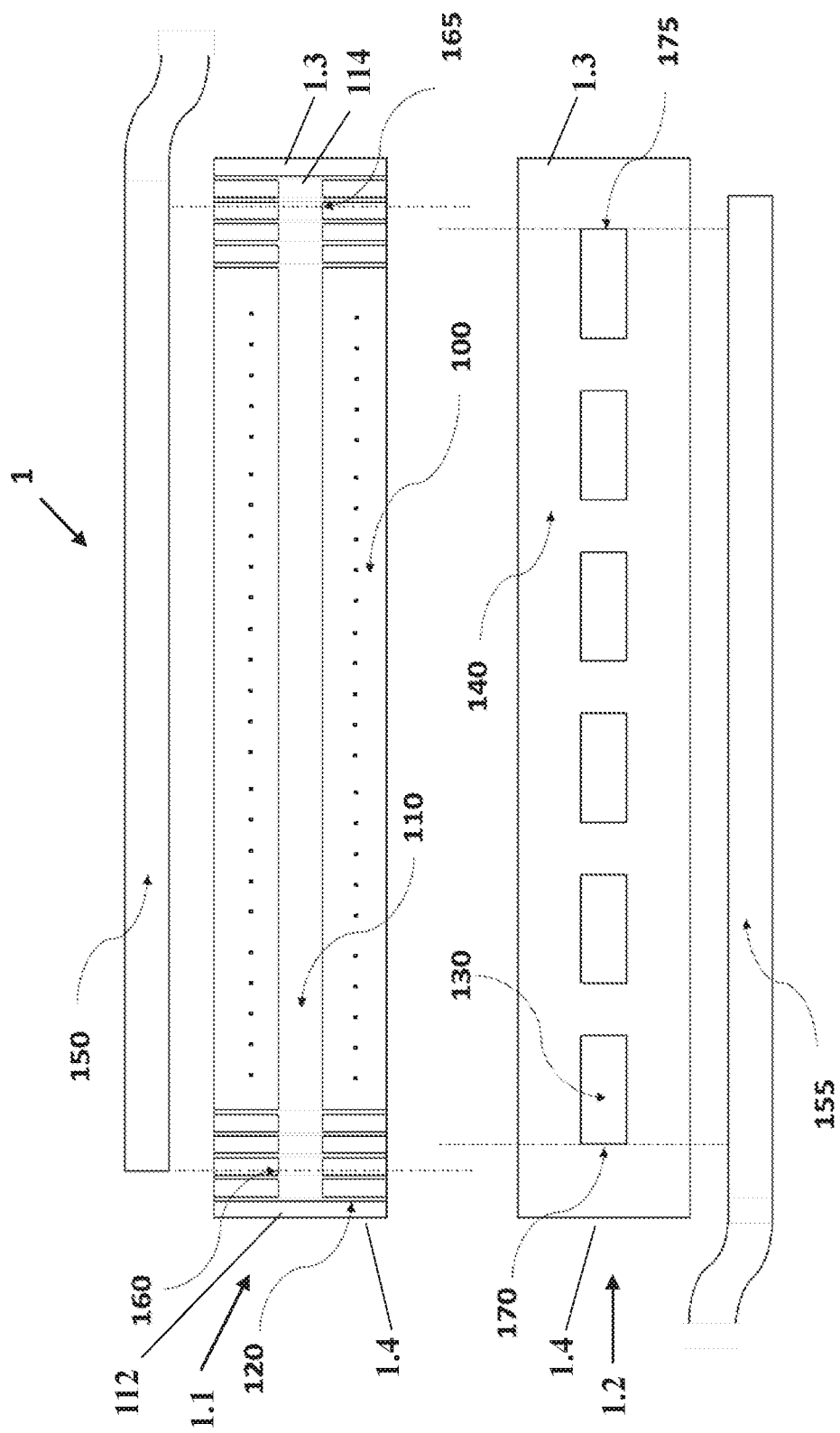
FIG. 1 is a schematic diagram that depicts the typical layout of metal electrodes (only one busbar is shown) of a mono-facial solar cell for busbar-based interconnection.

For ease of reference, in the following, the directional descriptors "longitudinal" and "transverse" are used for only those embodiments of solar cells having longitudinal and transverse axes. The transverse axis of a solar cell runs in a direction parallel to the fingers of a solar cell. The longitudinal axis is generally perpendicular to the transversal axis.

However, the shape of the solar cell is not a limiting factor of the scope of the invention. That is, it is not necessary for solar cells to have a shape which has a longitudinal axis.

One face of the solar cell, which in the case of a mono-facial solar cell is the face subject to direct sunlight, will be referred to as the "front", "upper" or "top" face. The opposite face will be referred to as the "rear", "lower" or "bottom" face. The descriptors "top", "upper", "bottom", and "lower" will also apply to electrodes (such as fingers, busbars, or electrode pads) which are located on the correspondingly referenced face of the solar cell. The skilled person will realize that in the case of bi-facial solar cells, the designations of "top" and "bottom" (or "upper" and "lower", or "front" and "rear") can be reversed. Any directional designations used are for reference purposes only, and should not be taken as limiting the scope of the invention, unless otherwise specified.

In the following detailed description, reference is made to accompanying drawings which form a part of the detailed description. The illustrative embodiments described in the detailed description, depicted in the drawings and defined in the claims, are not intended to be limiting. Other embodiments may be utilised and other changes may be made without departing from the spirit or scope of the subject matter presented. It will be readily understood that the aspects of the present disclosure, as generally described herein and illustrated in the drawings can be arranged, substituted, combined, separated and designed in a wide variety of different configurations, all of which are contemplated in this disclosure.

A method for reducing thermomechanical stress in solar cells is described below. Although described with reference to silicon solar cell provided with electrodes for an H-pattern interconnection, the method is applicable to photovoltaic devices comprising other absorber materials, and other electronic devices requiring electrical interconnection.

In one embodiment, applicable to stringing or tabbing interconnection between two or more mono-facial solar cells, the invention involves aligning the outer edge of the outermost rear electrode pad, located on a first longitudinal end (or more generally, a first edge portion) of the solar cell, with the edge of the corresponding front busbar. That is, the outer edge of the outermost rear electrode pad and the edge of the corresponding front busbar will be substantially equally distanced from the solar cell's first edge portion. One or both end sections of the or each front busbar will optionally have a reduced contact area for connection with the copper interconnector. As a further option, a plurality of outermost fingers, adjacent the edge portion of the solar cell's are connected to the front busbar via additional metal grid lines.

The described invention, in an embodiment applicable for tabbing interconnection between bifacial solar cells, involves aligning an end edge of the or each front busbar to the edge of its corresponding rear busbar at the same edge portion of the solar cell, so that they are each at the substantially same distance as each other from that edge portion. One or both end portions of the front and/or the rear busbars can have a reduced contact area for connection with the copper interconnector. Optionally, two or more outermost fingers are connected via additional metal grid lines.

In an embodiment applicable for MBB interconnection, in the case of between mono-facial solar cells, the invention comprises a solar cell having one or more arrays of front electrode pads, and one or more arrays of rear electrode pad, where the outer edge of the array of the front electrode pads, adjacent the solar cell's first edge portion, is aligned with the outer edge, adjacent the same edge portion, of the array of the rear electrode pads.

In an embodiment applicable for SWCT interconnection, in the case between mono-facial solar cells, the invention comprises a solar cell which includes two rear conducting lines aligned to the outermost finger on the front face.

In another embodiment, the present invention is a bi-facial solar cell which is provided with electrodes for SWCT interconnection. The outermost rear finger adjacent one edge portion of the rear face is aligned with the outermost finger adjacent the same edge portion on the front or opposite face of the solar cell. The same arrangement is provided on the second opposite edge portion of the solar cell.

FIG. 1 schematically depicts an example of prior art layout of metal electrodes of a mono-facial solar cell 1 for stringing/tabbing interconnection. The front surface 1.1 of the solar cell 1 is coated with a surface dielectric layer 100 that acts as an antireflection coating (ARC) layer. The front metal electrodes comprise one or more metal busbars 110, of which only one is shown, and a plurality of fingers 120. In the four to six busbar configuration, the busbar width is typically in the range of about 0.8 mm to 1.2 mm. The outer edge 112 of the front busbar 110, in general, is located at or near the adjacent outermost front finger 120, which is spaced from the solar cell edge 1.4, typically by about 1 mm.

Although the depicted busbar 110 is represented by a substantially rectangular shape, the busbar 100 can have different shapes or patterns, by the screen-printing of metal pastes onto the solar cell wafer. An array of metal fingers 120 perpendicular to the busbar 110 are distributed, typically at equal spacing, across the solar cell 1. For simplicity, in FIG. 1 only the first few fingers 120 near the edge portions 1.3, 1.4 of the solar cell are shown. The width of the fingers 120 is typically between 20 and 100 µm. A firing process is performed to allow the metal pastes to penetrate through the ARC and make intimate contact with the underlying silicon.

In some embodiments, the front metal electrodes 110 can be formed by ablating the ARC using a laser and followed by the deposition of a metal stack to the exposed silicon regions. The metal stack, preferably comprising layers of nickel, copper and a capping layer of silver or tin, can be formed by electro-less plating, by electro-plating, by using the light-induced current of the solar cell, or by forward biasing the solar cell with an external bias voltage or current.

On the rear surface 1.2 of the solar cell 1, there is provided an array of electrode pads 130 typically made from silver. Typically, the same number of electrode pad arrays are provided for each front busbar 110. The electrode pad array is center-aligned to the corresponding front busbar 110. That is, an imaginary central axis extending through the rear electrode pads 130 and an imaginary central axis extending through the corresponding front busbar 110 mirror each other through the thickness of the solar cell 1. The electrodes pads 130 are wider than the front busbar 110, with a typical width between 1.5 and 2.0 mm. The number of electrode pads ranges from one (i.e. a continuous electrode pad) and up to, for example, eight. The remaining area of the rear surface 1.2 is covered with screen-printed aluminum 140 which has full-area or local (i.e. partial) contact to the silicon. The aluminum layer 140 allows conduction of the electrical current generated by the solar cell 1. The rear electrode 130 are provided for solder connection to the tabbing ribbon, however, as aluminum has surface oxide which make soldering impractical.

In a stringing/tabbing interconnection process, the machine stretches the solder-coated copper ribbon from a ribbon spool and lays it onto an array of rear electrodes 130 as the rear ribbon 155 corresponding to that array of rear electrodes 130. A solar cell with front side 1.1 facing up is loaded and positioned so that the array of rear silver pads 130 and the corresponding rear ribbon 155 are center aligned with each other, that is, having coinciding imaginary central longitudinal axes. The end of the rear ribbon 155 is typically 0.5-15 mm inside the nearest edge 1.3 of the solar cell 1. The front ribbon 150 is then fed and aligned to the front busbar 110. The edge of front ribbon 150 is also 0.5 to 15 mm inside the nearest edge 1.4 of the solar cell 1.

The stringer machine typically uses rollers to apply local pressure and heat, to increase the ribbon temperature, to a temperature which is higher than the melting point of the solder coated on the ribbons 150, 155. After the machine stops the application of pressure and heat, mechanical bonding is formed between the front ribbon 150 and the front busbar 110, and between the rear ribbon 155 and the rear silver pads 130.

After the above-mentioned bonding, the soldered solar cell 1 is moved along the direction of the busbar(s) for a predefined distance, equal to the length of the solar cell plus a cell gap distance. The front ribbon 150 of the soldered solar cell becomes the rear ribbon for the next solar cell, by being bonded to a corresponding array of rear electrodes 130 of the next solar cell. This process is repeated to form a string of interconnected solar cells.

FIG. 1 shows that there are two bonding end points 160, 165 in the connection between the front ribbon 150 and the corresponding front busbar 110. One bonding end point 160 typically coincides with the free edge of the front ribbon 150, located close to one edge 1.4 of the solar cell 1. In existing mono-facial solar cells, the free edge of the front ribbon 150 is positioned at a distance of, e.g. 0.5 mm to 15 mm, from the nearest edge portion 1.4 of the solar cell 1. At the opposite edge portion 1.3 of the solar cell 1, the front ribbon 150 extends past the edge 1.3 of the solar cell, for tabbing connection with the next solar cell. Therefore, the other bonding end point 165 is located within a transition region where, during the bonding process, the local pressure becomes insufficient, or the local temperature becomes too low to melt the solder. Thus, the location of the other bonding end point 165 is determined by the stringing/tabbing process.

Because electrical current can flow through the conductive aluminum layer 140, on the rear side 1.2 of the solar cell 1, the outermost silver pads 130 are typically positioned further away from the wafer edge 1.4. Aluminum is a material difficult to solder due to its surface oxide.

Therefore, the two bonding end points 170 and 175 in the rear ribbon interconnection are each located at or adjacent the outer edge of a respective outermost rear electrode 130.

It is depicted in FIG. 1 that front ribbon 150 is mechanically bonded to the solar cell 1 between bonding end points 160 and 165, and the rear ribbon 155 is bonded to the solar cell 1 between bonding end points 170 and 175.

FIG. 1 depicts that in the existing solar cell 1, there is a misalignment between front and rear bonding end points 160 and 170 at one end 1.4 of the solar cell 1. There is also a misalignment between the front and rear bonding end points 165 and 175 at the second end 1.3 of the solar cell 1.

The inventors have simulated the effect of the placement of the front and rear bonding points on the induced tensile stress on the silicon wafer. Due to the aforementioned misalignment, the stress induced from the soldering connection with the front ribbon 150 differs from that from the rear ribbon 155. It has been demonstrated that the local maximum tensile stress in silicon, at the outer edges of the outermost rear electrode pads 130, can be as high as ~200 MPa. Such tensile stress leads to a high probability of fracture or micro-crack formation in the silicon.

Figure 2:
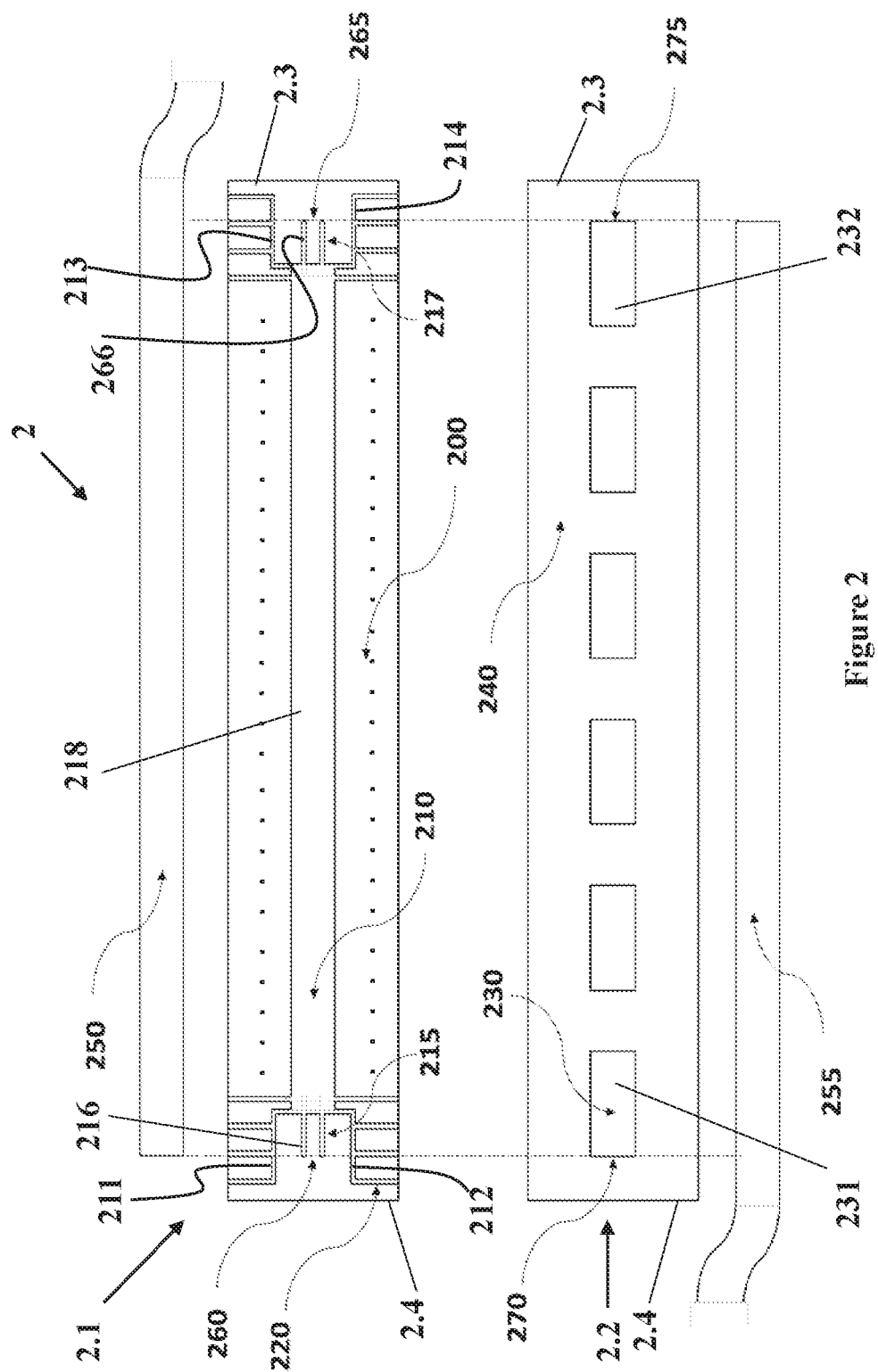
FIG. 2 is a schematic diagram that depicts the layout of metal electrodes (only one busbar is shown) of a mono-facial solar cell for busbar-based interconnection in accordance with an embodiment of the present invention.

FIG. 2 depicts the layout of metal electrodes of a mono-facial solar cell for stringing/tabbing interconnection, in accordance with an embodiment of the present invention. The layout of FIG. 2 differs from the prior art layout shown in FIG. 1. Specifically, the front busbars 210 of the solar cell 2 in accordance with present invention differs from the front busbars 110 of the prior art solar cell 1. At one longitudinal end of the front busbar 210, proximal to the adjacent longitudinal end or edge of the solar cell 2, there is an end section 215 having a reduced area. That is, within the end section 215, the conductive width of the busbar, as measured in the transverse direction of the solar cell 2, is reduced from the full-width of the busbar 210.

The opposite end of the front busbars 210 can also have a reduced area section 217. The two oppositely located reduced area sections 215, 217. In the embodiment shown in FIG. 2, the reduced area section 215 includes parallel lengths of reduced widths 216 which extend from the full-width part 218 of the busbar 210 towards the edge portion 2.4 of the solar cell 2. Similarly, the oppositely located reduced area section 217 includes parallel lengths of reduced widths 266 which extend from the full-length busbar portion 218 towards the opposite edge portion 2.3 of the solar cell 2.

The reduced-area busbar sections 215, 217 terminates at a distance of about 0.5 to 15 mm from the nearest solar cell edge 2.4, 2.3. The first few outermost front fingers 220 near the front busbar 210 are optionally "interrupted", that is, shorter in length and do not reach the front busbar 210. The interruption of the first few outermost fingers 220 avoids any potential bonding between the front fingers and the front ribbon 250 by soldering.

Figure 4:
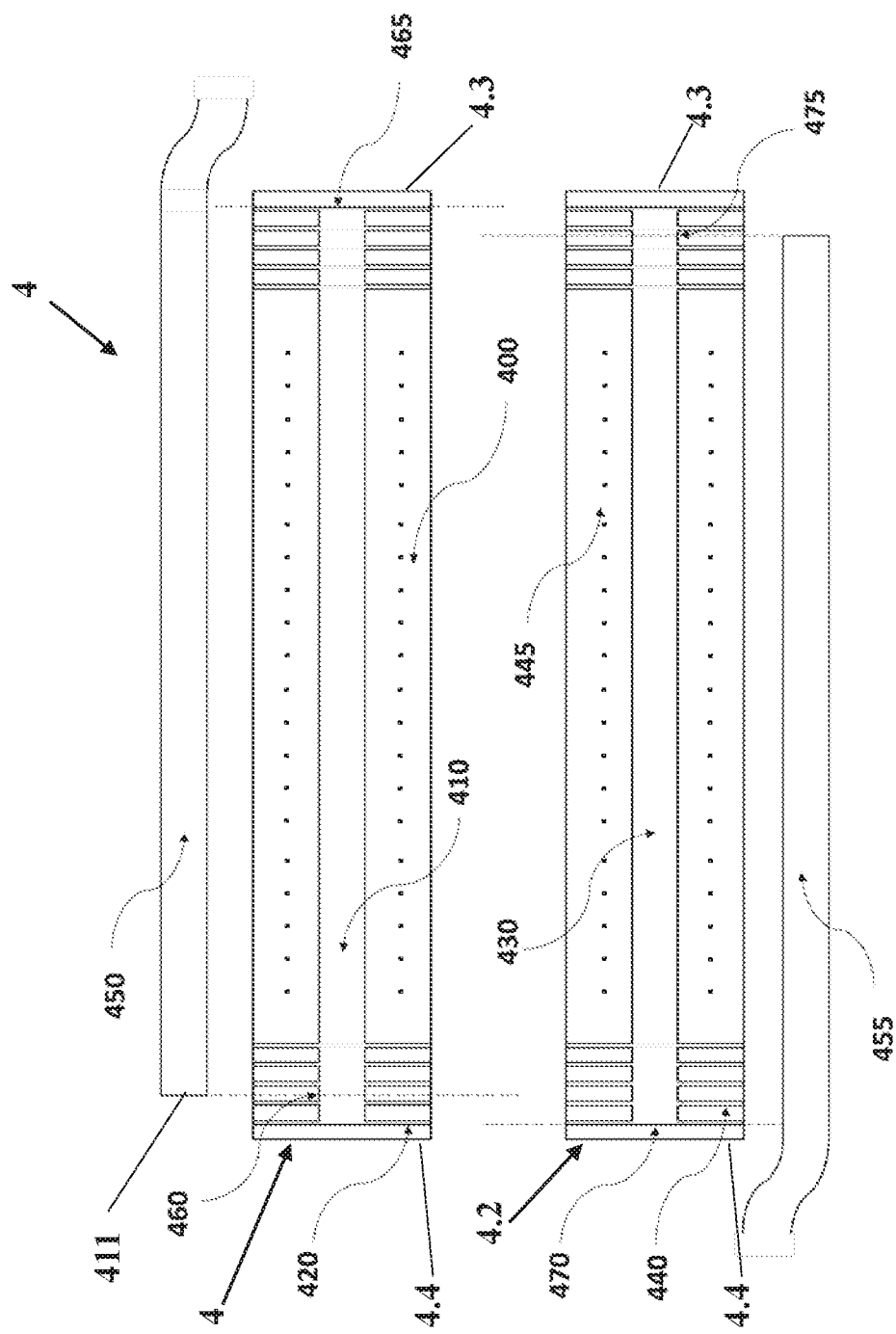

To collect the current conducted via the shorter fingers 220, additional metal grid lines 211, 212, 213, 214 are optionally provided to connect the fingers 220 to the front busbar 210. The layout depicted in FIG. 2 is an example. Other examples of the layout are shown in FIGS. 3-1 to 3-4. In FIG. 2, the layout of reduced-area busbar 215 and finger connection is symmetrically mirrored at the other edge of the cell. The mirroring is optional. The opposite reduced-area busbar, in further embodiments, are permitted to have different layouts.

During the stringing/tabbing process, the end of the front ribbon 250 is aligned to one end of the reduced-area busbar 215. The bonding end point 260 is at the end of the reduced-area busbar 215. Preferably, the front ribbon 250 is positioned so that the end of the front ribbon 250 is closer to the nearest edge 2.4 of the solar cell, by about 0.2 mm, than the end of the reduced-area busbar section 215. This ensures the boning end point 260 is positioned at the end of the reduced-area busbar 215.

At the opposite edge 2.3 of the solar cell, pressure and heating are supplied by the stringer machine to at least the end of the reduced-area busbar section 217 so that the bonding end point 265 aligns to the end of the reduced-area busbar 217.

The rear electrodes pads 230 are arranged, so as to align the outer edge of the outermost electrode pad 231 with the end of the reduced-area busbar 215. Preferably, the outer edge of the opposite outermost electrode pad 232 also aligns with the opposite end of the reduced area busbar section 217. When both outer edges of the rear electrode pad array 230 align with the edges of the busbar 210 at either edge portion of the solar cell 2, the length of the front busbar 210 is the same as the distance between the two outer edges of the rear electrode pad array 230.

The stringing/tabbing by the stringer machine is controlled to operate to apply heat and pressure, so that the rear bonding end points 270 and 275 are located at the outer edges of the outermost silver pads 231, 232. Thus, close to one edge portion 2.4 of the solar cell 2, the front bonding end point 260 is aligned with rear bonding end point 270. Close to the opposite edge portion 2.3 of the solar cell 2, the front bonding end point 265 is aligned with rear bonding end point 275. The dashed lines shown in FIG. 2 depicts the above-mentioned alignment. The thermomechanical stress in the solar cell 2 induced by the connection with the front ribbon 250 has a comparable magnitude but in the opposite direction, in relation to the thermomechanical stress induced in the solar cell 2 by the connection with the rear ribbon 255. The balanced but oppositely directed forces result in reduced overall stress in the solar cell.

In some embodiments, the outermost silver pads 231, 232 are positioned closer to the respective solar cell edges 2.4, 2.3, compared to the typical layout shown in FIG. 1. The individual pad size and pad pitch are preferably chosen to minimize the resistive power loss of current collection from the solar cell 2 to the rear ribbon 255.

In embodiments where the front busbar 210, at both the ends of the busbar's longitudinal axis, terminate respectively in reduced-area busbar sections 215 and 217, there are several potential causes for a misalignment between the front and rear bonding end points 260, 270 (and 265, 275), resulting in an increase in the induced thermomechanical stress in the solar cell 2. The misalignment could be caused by (1) the positioning misalignment between the front busbar 210 and the rear silver pads 230; (2) the positioning misalignment between the front ribbon 250 and the front busbar 210; or (3) the positioning misalignment between the rear ribbon 255 and the rear silver pads 230. However, because of the reduced amount of solder required at the reduced-area busbar sections 215, 217, the increase in the induced stress caused by this misalignment is smaller than the increase which would have been caused if the front busbar 250 had its full-width from end to end. The reduced-area busbar sections 215, 217 thus allow the thermomechanical stress in the solar cell to increase more slowly as the misalignment distance increases. Thus, the reduced-area busbar sections 215, 217 improves the tolerance of the solar cell 2 to variations in the tabbing/interconnection process.

As mentioned above, the reduced-area busbar sections 215, 217 at the ends of the front busbar 210 can have various patterns. FIGS. 3-1 to 3-4 show some examples, but other layouts or patterns are possible. In FIG. 3-1, the pattern comprises a single line 300 with a reduced width transversely across the front busbar 210. As shown in FIG. 3-2, the reduced area section 310 has multiple (two are shown) lines of reduced width, where the sum of the areas of the multiple lines is less than the area that the full-width busbar would have in the same section. In FIG. 3-3, the reduced area section 320 has a tapered shape 320. In FIG. 3-4, the reduced area busbar section 330 comprise crossed lines.

FIG. 4 schematically depicts a prior art example layout of metal electrodes of a bifacial solar cell for stringing/tabbing interconnection. Bifacial solar cells and modules can absorb light from both the front and the rear surfaces. It is advantageous as light reflected from the ground or background can be reflected back into the modules resulting in an energy conversion efficiency enhanced by an albedo factor, which can be as large as 30% in highly reflecting environments.

The layout for the front metal electrodes of a bifacial solar cell is the same as front electrode layout for a mono-facial solar cell. The front busbar 410 is typically connected between the outermost front finger 420, located at the edges 4.3, 4.4 of the longitudinal axis (i.e. the "longitudinal edges") of the front busbar 410. The bonding end point 460 nearest one edge portion 4.4 of the solar cell 4 is located at the free end 411 of the front ribbon 450. The opposite bonding end point 465, depending on the soldering process performed by the stringer machine, can be up to the end of the front busbar 410 adjacent the second edge portion 4.3 of the solar cell 4.

The rear metal electrodes of a bifacial solar cell 4 also comprise one or more busbar 430 (only one busbar 430 is shown) and fingers 440. The or each rear busbar 430 is aligned to the front busbar 410. Typically, the same pattern is used for both front and rear busbars. The parameters for the rear fingers 440, including width, thickness and pitch, can be different to those of the front fingers 420. On the rear face 4.2, one bonding end point 470, depending on the soldering process performed by the stringer machine, can be up to the first longitudinal end of the rear busbar 430. The other bonding end point 475 is located at the opposite and second longitudinal end of the rear ribbon 455.

In spite of the identical pattern for the front busbar 410 and the rear busbar 430, misalignment between the set of front and rear bonding end points 460 and 470 at one edge portion of the solar cell 4, and between the opposite set of front and rear bonding end points 465 and 475, can occur in bifacial solar cells. It is shown by simulation using finite element analysis that the thermomechanical stress induced in the solar cell with a misalignment distance of 1 mm can be similar to the stress in the mono-facial solar cells.

Figure 5:
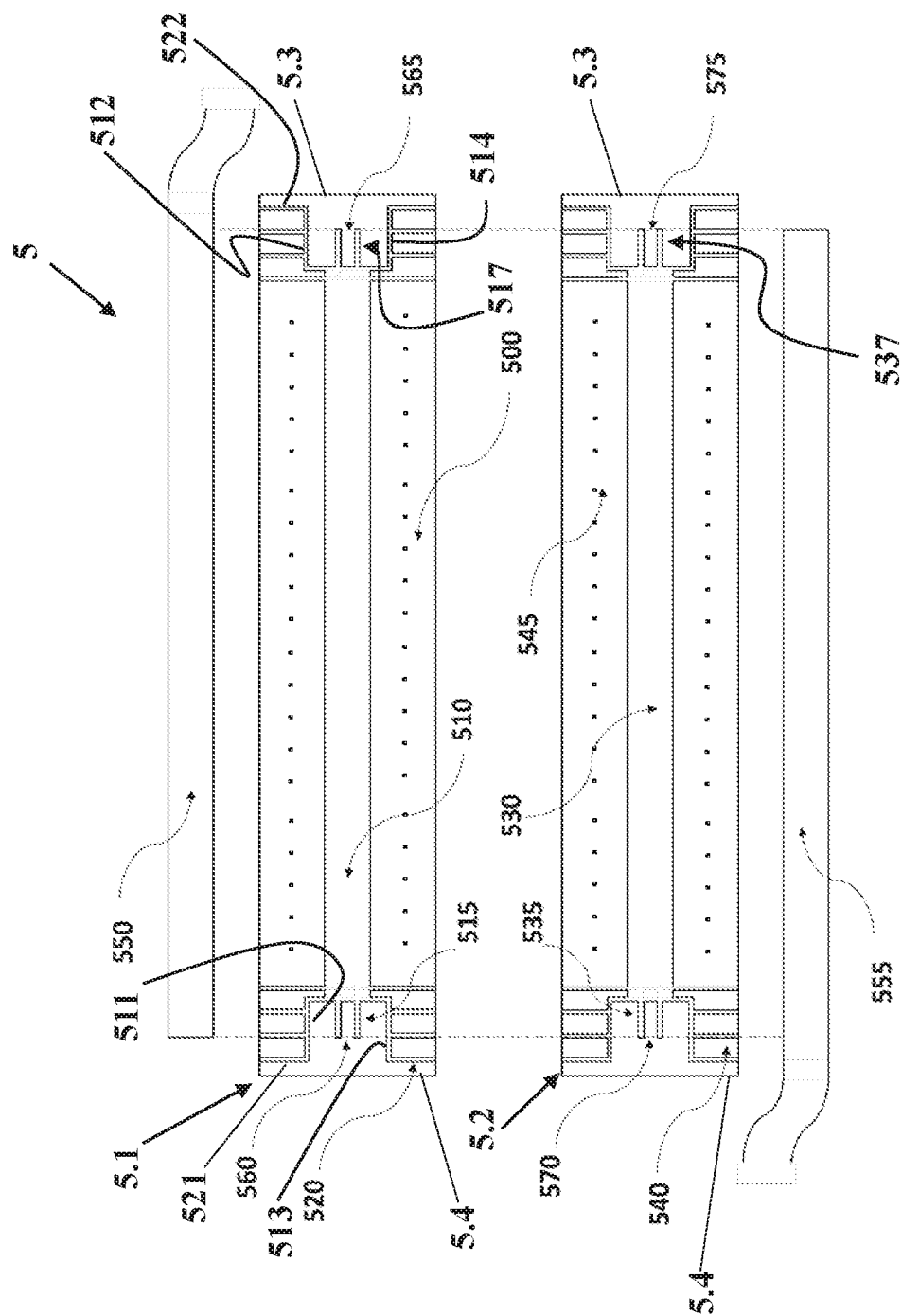
FIG. 5 is a schematic diagram that depicts the layout of metal electrodes (only one busbar is shown) of a bifacial solar cell for busbar-based interconnection in accordance with an embodiment of the present invention.

FIG. 5 depicts the layout of metal electrodes of a bifacial solar cell for stringing/tabbing interconnection in accordance with an embodiment of the present invention. The electrodes provided on the front side 5.1 of the solar cell 5 include one or more front busbars 510 (only one is shown, for simplicity) and fingers 520. There is a reduced-area busbar section 515, 517 at each longitudinal end of the front busbar 510. Similar to the reduced-area busbar section layouts shown in FIGS. 2 and 3, the outer end of the reduced-area busbar section 515 is spaced further from the adjacent solar cell edge 5.4 than the outermost finger 521. The same arrangement is preferably provided at the opposite end of the front busbar 510, where the outer end of the reduced-area busbar section 517 is spaced further from the adjacent solar cell edge portion 5.3 than the outermost finger 522 closest to the same solar cell edge portion 5.3.

At each edge portion of the solar cell 5, a plurality of outermost fingers is connected to the front busbar 510 via grid lines 511, 512, 513, 514. Each grid line 511, 512, 513, 514 includes a first portion which is transverse to the fingers and connects between the fingers 520, and a second portion which extends between the first grid line portion and the busbar 510. During the soldering process by the stringer machine, the first set of bonding end points 560 and 565 are ensured to aligned at the end of the reduced-area busbar sections 515, 517.

On the rear side 5.2 of the solar cell 5, the or each rear busbar 530, reduced-area busbar sections 535, 537 and rear fingers 540 have the same layout as the front metal electrodes. Optionally, the front and rear fingers 520, 540 are provided with different finger pitches.

The layout of the electrodes ensures that rear bonding end points 570 and 575 will be located at the end of the reduced-area busbar sections 535 and 537 of the rear busbar 530. The front reduced-area busbar sections 515, 517 are aligned with the rear reduced-area busbar sections 535, 537. Therefore, the two front bonding end points 560 and 565 are respectively aligned to each of the two rear bonding end points 570 and 575, respectively. Thus, the thermomechanical stress in the solar cell 5 is reduced by the alignment between the bonding end points, as the induced stress is balanced out. Misalignment can occur in the process of metal electrode fabrication and ribbon positioning. Beneficially, the reduced-area busbars sections 515, 517 and 535, 537 increase the tolerable misalignment distance. The other advantage is that they provide bonding locations which are farther from the solar cell's edge portions 5.3, 5.4 than one or more of the outermost front fingers, and are able to receive the photovoltaic currents from those front fingers.

Figure 6:
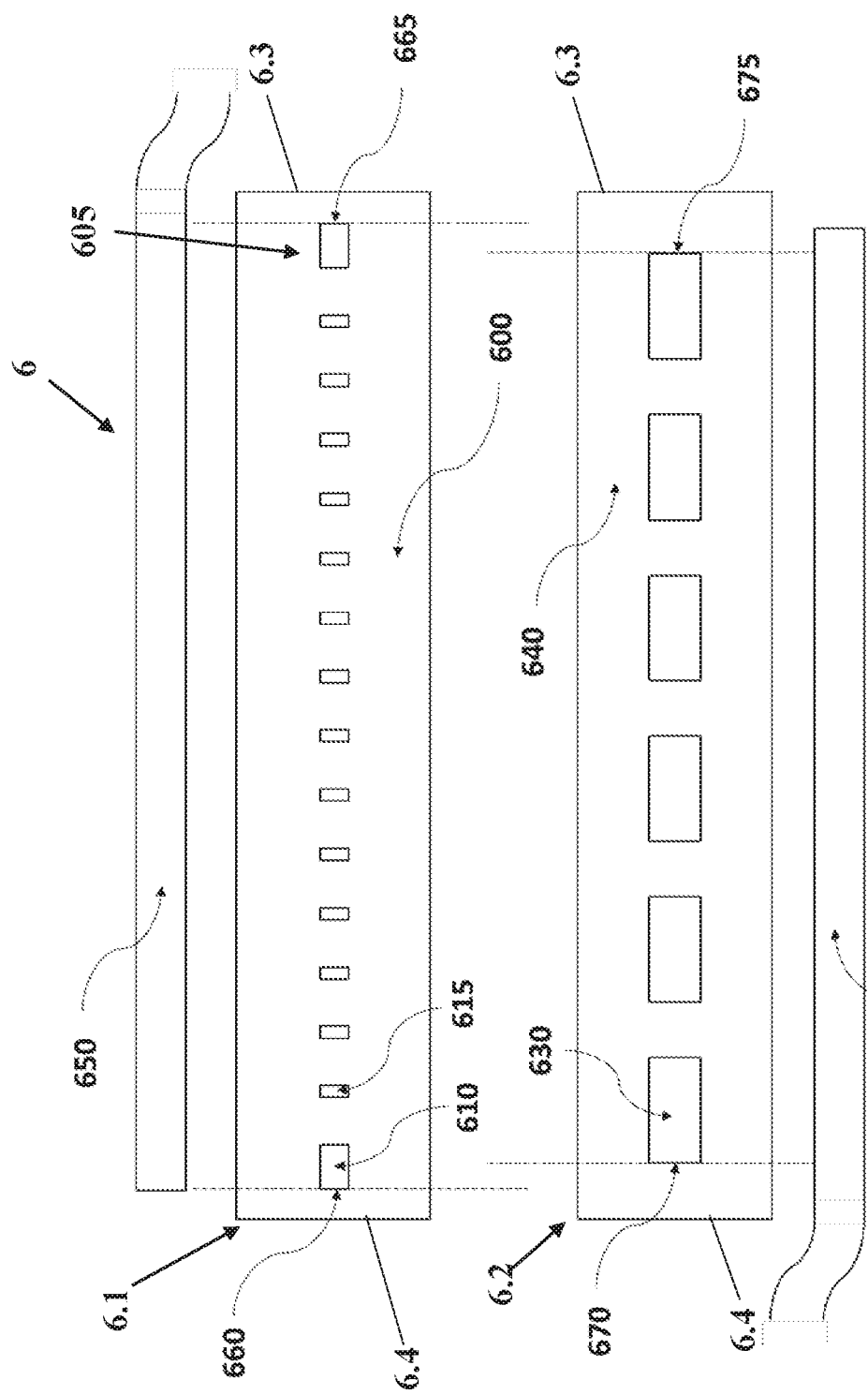
FIG. 6 is a schematic diagram that depicts an example of an existing layout of metal electrodes (only one wire connection is shown) of a mono-facial solar cell for MBB interconnection.

FIG. 6 schematically depicts an example in the prior art, of the layout of the metal electrodes of a mono-facial solar cell for MBB interconnection. The front metal electrodes comprise one or more arrays 605 of front electrode pads. Each front array 605 includes two outer pads 610 (one at each solar cell edge 6.3, 6.4) and a plurality of inner pads 615 located between the two outer pads 610. The outer pads 610 and the inner pads 615 have the same width as measured in the transverse direction of the solar cell 6, but may differ in the length as measured in the direction extending between the first and second edge portions 6.3, 6.4 of the solar cell 6. The outer pads 610 may be longer in length to provide sufficient adhesion of the front copper wire 650 to the solar cell 6. Since the anti-reflection coating (ARC) layer 600 is not solderable, the set of front bonding end points 660 and 665 will be respectively located at the outer edges of the two outer pads 610.

The rear metal electrodes for MBB interconnection comprise an array of pads 630 that are distributed along the length of the solar cell 6 at equal spacing from each other. In some cases the front surface is provided with the same number of electrode pad arrays as there are electrode pad arrays on the rear surface. In these cases, each array is optionally centre-aligned with a corresponding array 605 of front pads 610, 615. That is, the imaginary central longitudinal axis of each rear array of pads 630 is in alignment with the imaginary central longitudinal axis of the corresponding array 605 of front pads 610, 615. The set of rear bonding end points 670 and 675 are each located at the outer edges of the two outermost pads 630. The two front outer pads 610 are each typically positioned closer to the corresponding nearest solar cell edge portion 6.3, 6.4 than the two outermost pads on the rear side 6.2 of the solar cell 6. In this prior art layout, micro-crack can potentially form in the solar cell 6 although the cross-sectional area of copper wires used in MBB interconnection is smaller than the copper ribbons used in stringing/tabbing interconnection.

Figure 7:
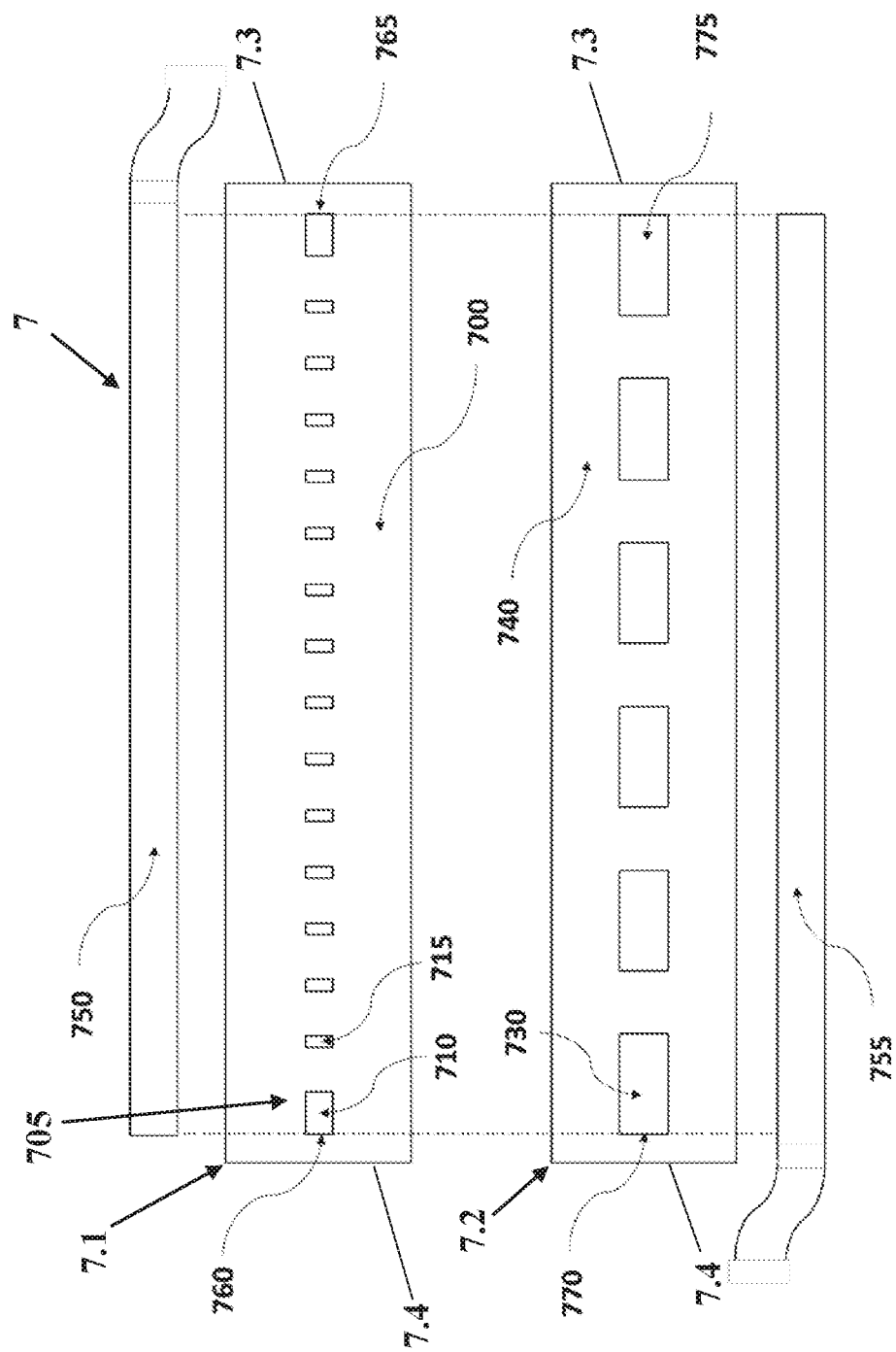
FIG. 7 is a schematic diagram that depicts the layout of metal electrodes (only one wire connection is shown) of a mono-facial solar cell for MBB interconnection, in accordance with an embodiment of the present invention.

FIG. 7 depicts the layout of metal electrodes of a mono-facial solar cell 7 for MBB interconnection, in accordance with an embodiment of the present invention. Similar to the arrangement shown in FIG. 6, The solar cell 7 includes one or more arrays 705 of front electrode pads, including outer pads 710 and a plurality of inner pads 715 therebetween. However, in the solar cell 7 shown in FIG. 7, the rear pads 730 are positioned such that the outer edges of the two outermost pads 730 are at the same distance from the solar cell's edge portions 7.3, 7.4, as the outermost edges of the two front outer pads 710 of the front electrode array. The distance between two adjacent rear pads or the length of the rear pads are optionally adjusted so that no additional resistive power loss will incur due to the changes in the positions of the rear pads. Because the outer edges of the outermost front and rear pads are aligned, the stress induced in the solar cell 7, in the most critical high stress regions, is balanced between the front and rear sides 7.1, 7.2 of the solar cell 7, resulting in an overall stress reduction in the solar cell 7 compared to the prior art.

Figure 8:
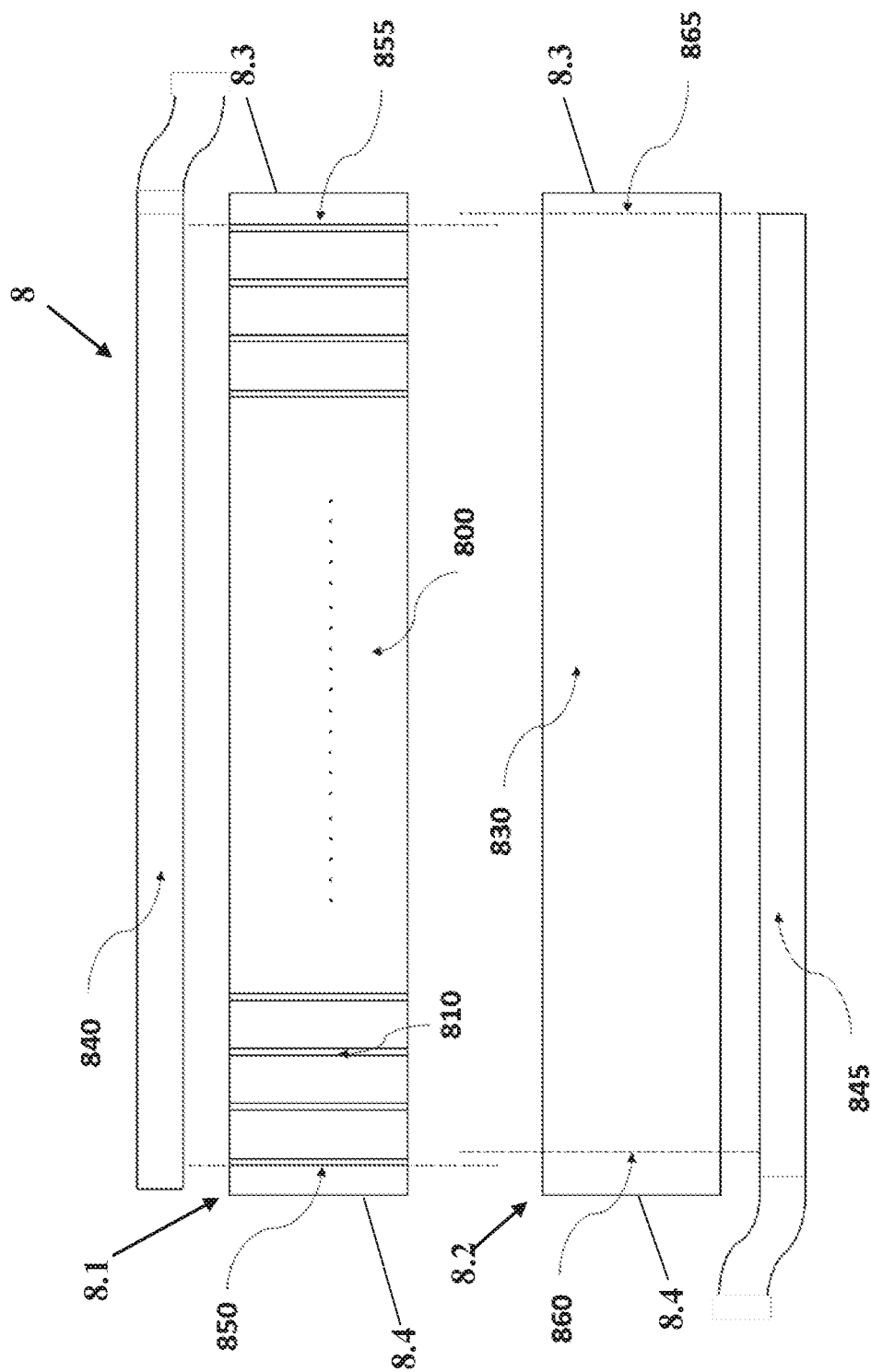
FIG. 8 is a schematic diagram that depicts an example of an existing layout of wire-embedded polymer (only one wire is shown) of a mono-facial solar cell for SWCT interconnection.

FIG. 8 schematically depicts an example of a prior art layout of metal electrodes of a mono-facial solar cell for SWCT interconnection. Busbars are not required for SWCT interconnection. Thus, the front side 8.1 of the solar cell 8 includes the ARC layer 800 and an array of equal-distanced fingers 810. The front bonding end points 850 and 855 are thus located at the two outermost fingers. The adhesive on the polymer sheet in which the copper connection wires 840 are embedded may provide additional adhesion for the copper wires 840 to bond with the solar cell 8. However, this supportive force provided by the adhesion is expected to be relatively uniform across the cell surface. No rear electrode pads are required for solar cells interconnected by SWCT, because the whole rear surface 8.2 is screen-printed aluminum 830. One set of rear bonding end points 860, 865 are therefore located at the respective ends of each rear copper wire 845. However, it is difficult to precisely locate the bonding end point 860 where the continuous end of the rear wire 840 is attached to the aluminum layer 830, because it depends on the lamination process for the sheet of embedded interconnection wires 845, and the stretching and contact condition of each individual copper wire 845 to the rear surface 8.3. When there is a misalignment between the bonding end point 850 and 860 near one edge 8.4 of the solar cell 8, and/or between the opposite front and rear bonding end points 855 and 865, substantial stress in the solar cell can result.

Figure 9:
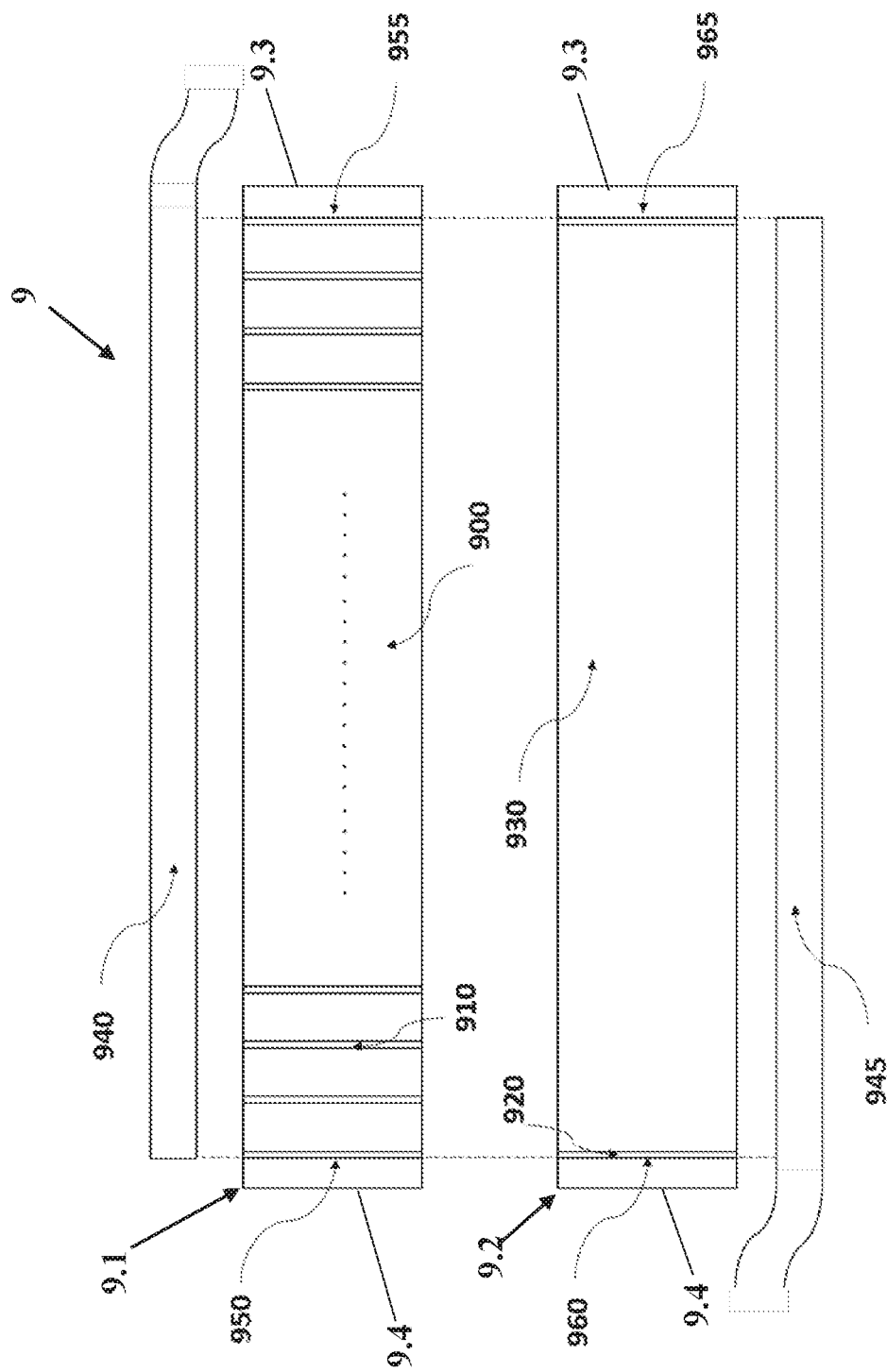
FIG. 9 is a schematic diagram that depicts the layout of wire-embedded polymer (only one wire is shown) of a mono-facial solar cell for SWCT interconnection, in accordance with an embodiment of the present invention.

FIG. 9 depicts the layout of metal electrodes of a mono-facial solar cell 9 for SWCT interconnection, in accordance with an embodiment of the present invention. On the front surface 9.1 of the solar cell 9, there is provided an array of front fingers 910, as in the prior art. However, on the rear surface 9.2, the solar cell 9 further includes at least one solderable conductive line 920, which is in alignment with the front outermost finger 910, at each edge portion 9.3, 9.4 of the solar cell 9. The rest of the rear surface 9.2 comprises the aluminum layer 930. The conductive lines 920 are made of silver, or other solderable conductive material.

The width of the conductive lines 920 can be the same as or different than the width of the front fingers 910. The conductive line 920 thickness should be at least the same as the thickness of the rear aluminium layer 930. That is the conductive lines 920 need to be flush with or extend proud of the aluminum layer 930. During the lamination process, a low-temperature solder coated on the rear wire 945 will form better mechanical bonding to the conductive lines 920 than the aluminium layer 930 as silver has good solderability. The rear bonding end points 960 and 965 are discrete in that they are confined to the two conductive lines 920. This arrangement achieves an alignment between the set bonding end points 950 and 960 located near one edge portion 9.4 of the solar cell, and between the oppositely located set of bonding end points 955 and 965. Thus, thermomechanical stress in the solar cell is reduced.

Figure 10:
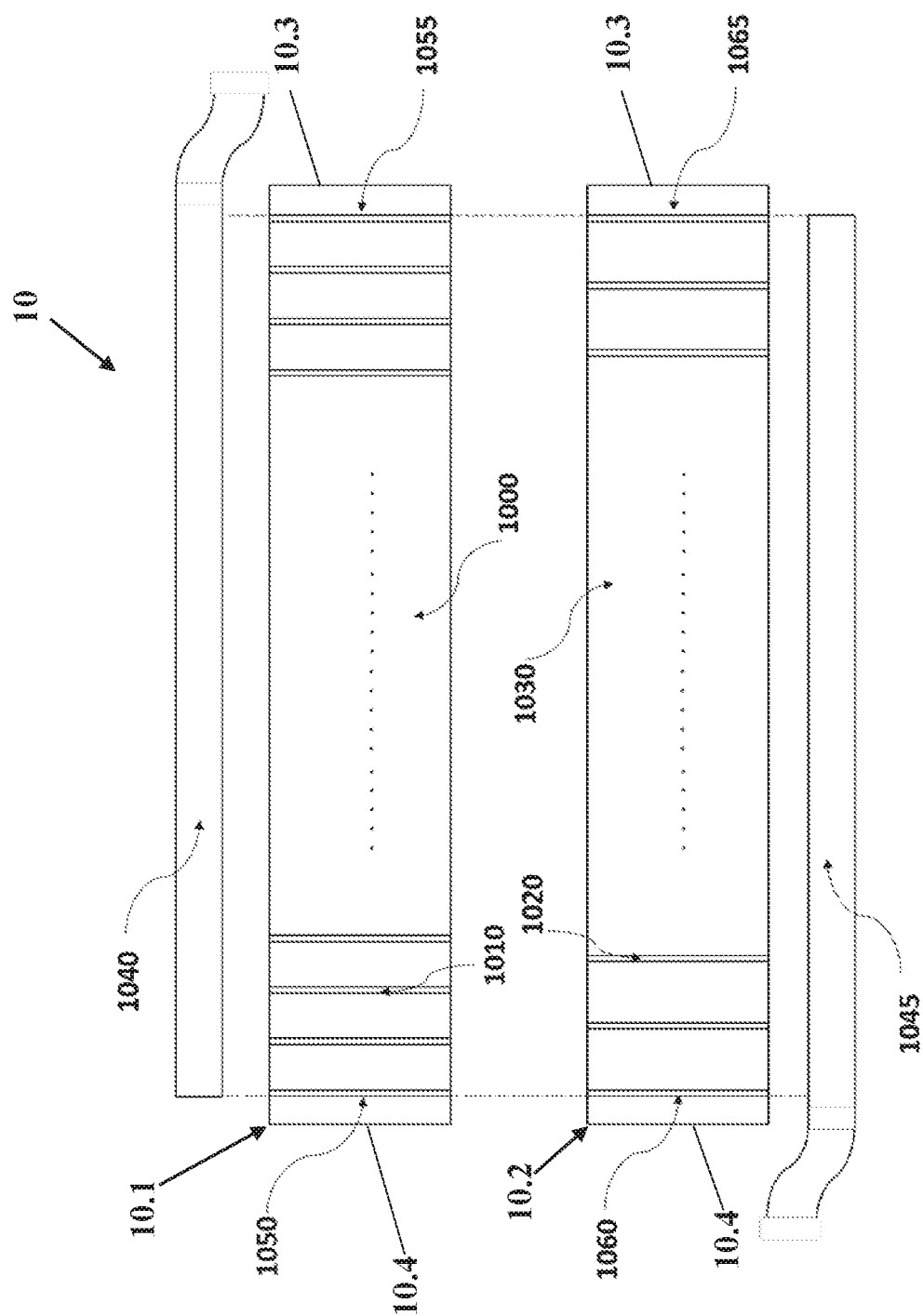
FIG. 10 is a schematic diagram that depicts an example of layout of wire-embedded polymer (only one wire is shown) of a bifacial solar cell for SWCT interconnection, in accordance with an embodiment of the present invention.

FIG. 10 depicts the layout of metal electrodes of a bifacial solar cell for SWCT interconnection, in accordance with another embodiment of the present invention. The layout of the front fingers 1010 is the same as that of mono-facial solar cells. An array of rear fingers 1020 are equally distributed on the rear surface 10.2. The rear finger pitch is optionally, but typically, different to the front finger pitch. As in the embodiment shown in FIG. 9, the rear outermost fingers

1020 are respectively aligned to a corresponding one of the front outermost fingers 1010. That is they are both at the same distance from the solar cell's edge portions 10.3, 10.4. The difference is that one or more intermediate rear fingers 1020 are further included between the two outermost rear fingers.

In the above description, an "alignment" between different parts of the solar cell is achieved, if those parts are equally distanced or spaced from each edge portion of the solar cell.

The skilled person will further understand that "equal" spacing or distance does not strictly require an exact and identical spacing or distance. What it requires is a substantial equality of the spacing or distance, within a small range of, e.g., plus or minus 0.1 mm.

The proposed invention, in the various embodiments described above, is applicable to both mono-facial and bifacial solar cells. It can be used in all the commercialized H-pattern interconnection, from busbar-based interconnection (stringing/tabbing) to wire-based interconnection (MBB and SWCT).

An advantage of the proposed invention is the reduction in the thermomechanical stress in the solar cells induced by the interconnection process, without substantially affecting the electrical performance of solar cells and modules.

The thermomechanical stress in the solar cells is reduced, by using the existing automated equipment for the interconnection process.

The proposed invention results in an improvement in the tolerance of misalignment due to process variation of positioning accuracy of solar cells, during the metal electrode fabrication or interconnection process.

Embodiments of the present invention reduce the thermomechanical stress in the solar cells that are interconnected by stringing/tabbing, MBB or SWCT.

Variations and modifications may be made to the parts previously described without departing from the spirit or ambit of the disclosure.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The invention claimed is:

1. A solar cell having a front surface and a rear surface, each extending between a first edge portion of the solar cell and a second, opposite, edge portion of the solar cell;
    the front surface including one or more front busbars, each front busbar extending in a direction defined by an axis extending between the first and second edge portions of the solar cell and each front busbar including first and second end sections that terminate respectively at first and second ends of the front busbar, wherein a conductive width of the front busbar except the first and second end sections is constant, a conductive width of the first and second end sections of each front busbar is smaller than a full width of the front busbar, as measured in a direction transverse to the axis extending between the first and second edge portions of the solar cell, and the conductive width of the first and second end sections of the front busbar is reduced, proximal to the first and second edge portions of the solar cell respectively, wherein each front busbar is for forming a front electro-mechanical bond with a front side connector that is adapted to interconnect the solar cell with one or more further solar cells, wherein the front electro-mechanical bond between the front side connector and each front busbar has a first front bonding end point at the first end section of the front busbar and a second front bonding end point at the second end section of the front busbar, which first and second bonding end points are respectively adjacent but spaced from the first and second edge portions of the solar cell;
    the rear surface including one or more rear electrodes or rear electrode arrays, the rear electrode or rear electrode array for forming a rear electro-mechanical bond with a rear side connector that is adapted to interconnect the solar cell with one or more further solar cells, wherein the rear electro-mechanical bond between the rear side connector and the rear electrode or rear electrode array has a first rear bonding end point and a second rear bonding end point which are respectively adjacent but spaced from the first and second edge portions of the solar cell;
    wherein the one or more front busbars, and the one or more rear electrodes or rear electrode arrays, are positioned to:
    define locations of the first front bonding end point and the first rear bonding end point such that a distance between the first front bonding end point and the first edge portion of the solar cell is substantially equal to a distance between the first rear bonding end point and the first edge portion of the solar cell, and
    define locations of the second front bonding end point and the second rear bonding end point such that a distance between the second front bonding end point and the second edge portion of the solar cell is substantially equal to a distance between the second rear bonding end point and the second edge portion of the solar cell.

2. A solar cell as claimed in claim 1, wherein the first and second end sections of each front busbar are respectively spaced from the first and second edge portions of the solar cell by about 0.5 mm to 15 mm.

3. A solar cell as claimed in claim 1, further comprising, at each of the first and second edge portions of the solar cell, for each front busbar, at least one conductive grid line which electrically connects one or more of outermost front finger electrodes to that front busbar.

4. A solar cell as claimed in claim 1, wherein each rear electrode or rear electrode array has a first outer edge proximal to the first edge portion of the solar cell, and a second outer edge proximal to the second edge portion of the solar cell, wherein a distance between said first outer edge and the first edge portion of the solar cell is substantially equal to a distance between the first end of each front busbar and the first edge portion of the solar cell, and wherein a distance between said second outer edge and the second edge portion of the solar cell is substantially equal to a distance between the second end of each front busbar and the second edge portion of the solar cell.

5. A solar cell as claimed in claim 4, wherein the one or more rear electrodes or rear electrode arrays are each an array of electrode pads.

6. A solar cell as claimed in claim 1, wherein the one or more rear electrodes or rear electrode arrays are one or more longitudinal rear busbars, each being in correspondence with a respective one of the one or more front busbars, each rear busbar including first and second end sections that terminate respectively at first and second ends of the rear busbar, wherein a conductive width of the first and second end sections of each rear busbar is smaller than a full width of the rear busbar.

7. A solar cell as claimed in claim 6, wherein the one or more front busbars are positioned so that they terminate at distances from the first and second edge portions of the solar cell that are substantially equal to distances from the first and second edge portions of the solar cell that the one or more rear busbars terminate.

8. A solar cell as claimed in claim 7, wherein the one or more front busbars and the one or more rear busbars are identical.

9. A solar cell as claimed in claim 1, wherein each of the first and second end sections of each front busbar comprises one conductive section having a shape which terminates toward a proximal longitudinal end of the solar cell.

10. A solar cell as claimed in claim 1, wherein said solar cell is a mono-facial solar cell.

11. A solar cell as claimed in claim 1, wherein said solar cell is a bi-facial solar cell and wherein said front face and said rear face of the solar cell are identical or non-identical.

12. A solar module comprising two or more solar cells, as claimed in claim 1, interconnected together via tabbing or ribbon interconnection.

13. A solar cell as claimed in claim 1, wherein each of the first and second end sections of each front busbar has a tapered shape.

14. A solar cell having a front surface and a rear surface, each extending between a first edge portion of the solar cell and a second, opposite, edge portion of the solar cell;
the front surface including one or more front busbars, each front busbar extending in a direction defined by an axis extending between the first and second edge portions of the solar cell and each front busbar including first and second end sections that terminate respectively at first and second ends of the front busbar, wherein a conductive width of the first and second end sections of the front busbar is smaller than a full width of the front busbar, as measured in a direction transverse to the axis extending between the first and second edge portions of the solar cell, a conductive width of the front busbar except the first and second end sections is constant, and the conductive width of the first and second end sections of the front busbar is reduced, proximal to the first and second edge portions of the solar cell respectively, wherein each front busbar is for forming a front electro-mechanical bond with a front side connector that is adapted to interconnect the solar cell with one or more further solar cells, wherein the front electro-mechanical bond between the front side connector and each front busbar has a first front bonding end point at the first end section of the front busbar and a second front bonding end point at the second end section of the front busbar, which first and second bonding end points are respectively adjacent but spaced from the first and second edge portions of the solar cell;
the rear surface including one or more rear electrodes or rear electrode arrays, the rear electrode or rear electrode array for forming a rear electro-mechanical bond with a rear side connector that is adapted to interconnect the solar cell with one or more further solar cells, wherein the rear electro-mechanical bond between the rear side connector and the rear electrode or rear electrode array has a first rear bonding end point and a second rear bonding end point which are respectively adjacent but spaced from the first and second edge portions of the solar cell;
wherein the one or more front busbars, and the one or more rear electrodes or rear electrode arrays, are positioned to:
define locations of the first front bonding end point and the first rear bonding end point such that a distance between the first front bonding end point and the first edge portion of the solar cell is substantially equal to a distance between the first rear bonding end point and the first edge portion of the solar cell, and
define locations of the second front bonding end point and the second rear bonding end point such that a distance between the second front bonding end point and the second edge portion of the solar cell is substantially equal to a distance between the second rear bonding end point and the second edge portion of the solar cell;
wherein the front surface further includes a plurality of front finger electrodes which are transverse to the one or more front busbars,
said plurality of front finger electrodes including a first outermost front finger electrode proximal to the first edge portion of the solar cell, and a second, opposite, outermost front finger electrode proximal to the second edge portion of the solar cell,
a distance between the first edge portion of the solar cell and the first front outmost finger electrode is smaller than a distance between the first edge portion of the solar cell and the first end of each front busbar,
a distance between the second edge portion of the solar cell and the second front outmost finger electrode is smaller than a distance between the second edge portion of the solar cell and the second end of each front busbar, and
at least one of the plurality of front finger electrodes is closer to the first edge portion of the solar cell than the first front bonding end point, and at least one of the plurality of front finger electrodes is further from the first edge portion of the solar cell than the first front bonding end point.

15. A solar cell as claimed in claim 14, wherein each front busbar extending in a direction defined by an axis extending between the first and second edge portions of the solar cell and each front busbar including first and second end sections that terminate respectively at first and second ends of the front busbar, wherein the first and second end sections of each front busbar are respectively spaced from the first and second edge portions of the solar cell by about 0.5 mm to 15 mm.

16. A solar cell as claimed in claim 14, further comprising, at each of the first and second edge portions of the solar cell, for each front busbar, at least one conductive grid line which electrically connects one or more of the outermost front finger electrodes to that front busbar.

17. A solar cell as claimed in claim 14, wherein each rear electrode or rear electrode array has a first outer edge proximal to the first edge portion of the solar cell, and a second outer edge proximal to the second edge portion of the solar cell, wherein a distance between said first outer edge and the first edge portion of the solar cell is substantially equal to a distance between the first end of each front busbar and the first edge portion of the solar cell, and wherein a distance between said second outer edge and the second edge portion of the solar cell is substantially equal to a distance between the second end of each front busbar and the second edge portion of the solar cell.

18. A solar cell having a front surface and a rear surface, each extending between a first edge portion of the solar cell and a second, opposite, edge portion of the solar cell;

the front surface including one or more front busbars, each front busbar extending in a direction defined by an axis extending between the first and second edge portions of the solar cell and each front busbar including first and second end sections that terminate respectively at first and second ends of the front busbar, wherein a conductive width of each front busbar except the first and second end sections is constant, a conductive width of the first and second end sections of each front busbar is smaller than a full width of the front busbar, as measured in a direction transverse to the axis extending between the first and second edge portions of the solar cell, and the conductive width of the first and second end sections of each front busbar is reduced, proximal to the first and second edge portions of the solar cell respectively, wherein each front busbar is for forming a front electro-mechanical bond with a front side connector that is adapted to interconnect the solar cell with one or more further solar cells, wherein the front electro-mechanical bond between the front side connector and each front busbar has a first front bonding end point at the first end section of the front busbar and a second front bonding end point at the second end section of the front busbar, which first and second bonding end points are respectively adjacent but spaced from the first and second edge portions of the solar cell;

the rear surface including one or more rear electrodes or rear electrode arrays, the rear electrode or rear electrode array for forming a rear electro-mechanical bond with a rear side connector that is adapted to interconnect the solar cell with one or more further solar cells, wherein the rear electro-mechanical bond between the rear side connector and the rear electrode or rear electrode array has a first rear bonding end point and a second rear bonding end point which are respectively adjacent but spaced from the first and second edge portions of the solar cell;

wherein the one or more front busbars, and the one or more rear electrodes or rear electrode arrays, are positioned to:

define locations of the first front bonding end point and the first rear bonding end point such that a distance between the first front bonding end point and the first edge portion of the solar cell is substantially equal to a distance between the first rear bonding end point and the first edge portion of the solar cell, and define locations of the second front bonding end point and the second rear bonding end point such that a distance between the second front bonding end point and the second edge portion of the solar cell is substantially equal to a distance between the second rear bonding end point and the second edge portion of the solar cell;

wherein the front surface further includes a plurality of outermost front finger electrodes which are transverse to the one or more front busbars, the plurality of front finger electrodes are connected to the first and second end sections of each front busbar via conductive grid lines respectively, and the plurality of front finger electrodes are respectively closer to the first and second edge portions of the solar cell than the first and second front bonding end points.

19. A solar cell as claimed in claim 18, wherein the first and second end sections of each front busbar are respectively spaced from the first and second edge portions of the solar cell by about 0.5 mm to 15 mm.

20. A solar cell as claimed in claim 18, wherein each rear electrode or rear electrode array has a first outer edge proximal to the first edge portion of the solar cell, and a second outer edge proximal to the second edge portion of the solar cell, wherein a distance between said first outer edge and the first edge portion of the solar cell is substantially equal to a distance between the first end of each front busbar and the first edge portion of the solar cell, and wherein a distance between said second outer edge and the second edge portion of the solar cell is substantially equal to a distance between the second end of each front busbar and the second edge portion of the solar cell.

* * * * *